US006788074B2

United States Patent
Sarma et al.

(10) Patent No.: US 6,788,074 B2
(45) Date of Patent: Sep. 7, 2004

(54) SYSTEM AND METHOD FOR USING A CAPACITANCE MEASUREMENT TO MONITOR THE MANUFACTURE OF A SEMICONDUCTOR

(75) Inventors: Robin C. Sarma, Plano, TX (US); Michael J. McNutt, El Toro, CA (US); Yu-Sang Lin, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 10/176,888

(22) Filed: Jun. 21, 2002

(65) Prior Publication Data

US 2003/0234655 A1 Dec. 25, 2003

(51) Int. Cl.[7] .......................... G01R 27/26; H01L 21/66; G06F 19/00

(52) U.S. Cl. .......................... 324/663; 324/765; 438/17; 700/121

(58) Field of Search .................. 324/663, 671, 324/672, 662, 678, 658, 765, 158.1, 519; 438/10, 17–18; 702/85; 700/121

(56) References Cited

U.S. PATENT DOCUMENTS

| 4,962,461 A | * | 10/1990 | Meyer et al. | 438/8 |
|---|---|---|---|---|
| 5,999,010 A | | 12/1999 | Arora et al. | 324/765 |
| 6,166,607 A | * | 12/2000 | Schoellkopf | 331/57 |
| 6,291,254 B1 | * | 9/2001 | Chou et al. | 438/18 |
| 6,366,098 B1 | * | 4/2002 | Froment | 324/678 |
| 6,404,222 B1 | * | 6/2002 | Fan et al. | 324/765 |
| 6,501,283 B2 | * | 12/2002 | Lindolf et al. | 324/679 |

* cited by examiner

*Primary Examiner*—Anjan K. Deb
(74) *Attorney, Agent, or Firm*—Peter K. McLarty; W. James Brady, III; Frederick J. Telecky, Jr.

(57) ABSTRACT

A method for measuring a capacitance of a semiconductor is provided that includes positioning a measurement circuit in a scribe line area associated with the semiconductor. The scribe line area is indicative of a delineation that separates one or more portions of the semiconductor. A capacitance of one or more elements included within the one or more portions of the semiconductor is then measured using the measurement circuit. The method also includes comparing the capacitance measurement of the one or more elements included within the one or more portions of the semiconductor to a reference set of capacitance values such that a parameter associated with a manufacturing process that generated the semiconductor may be checked.

16 Claims, 4 Drawing Sheets

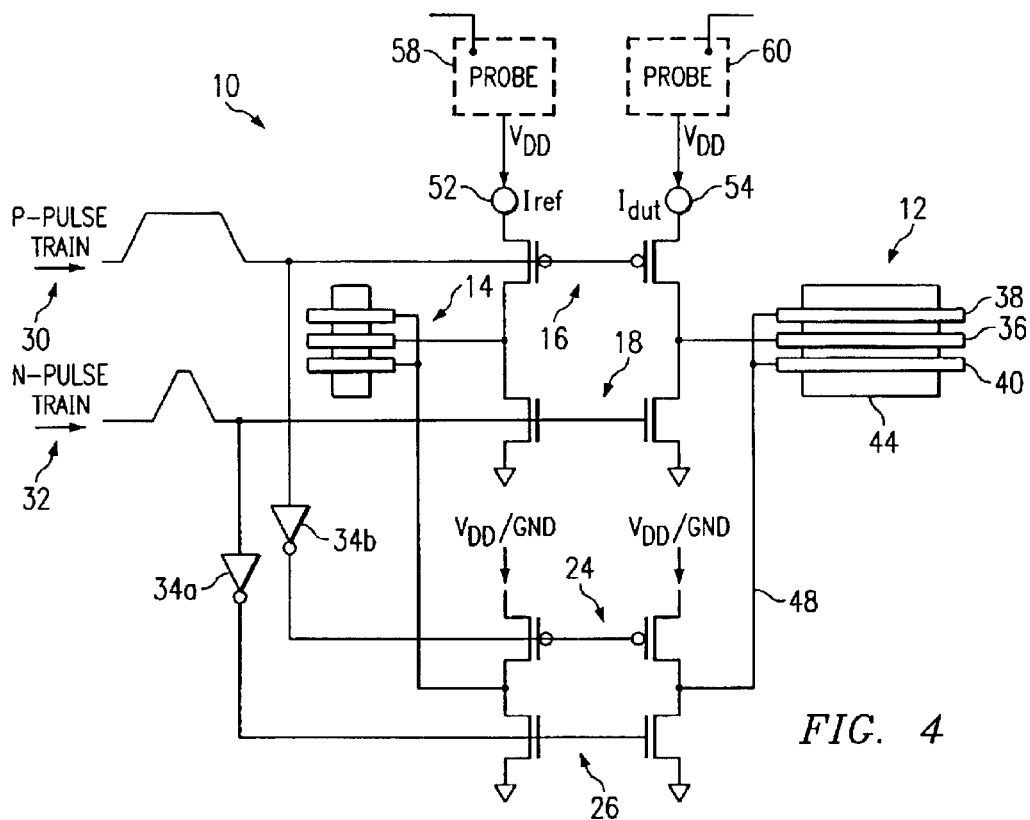
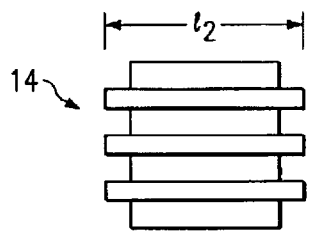
FIG. 5A
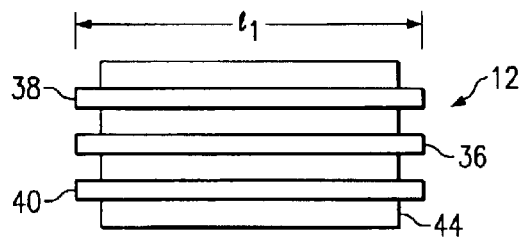
FIG. 5B
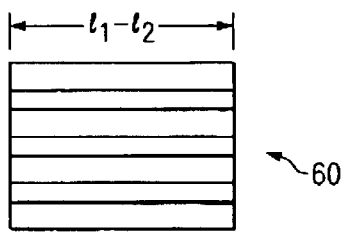
FIG. 5C

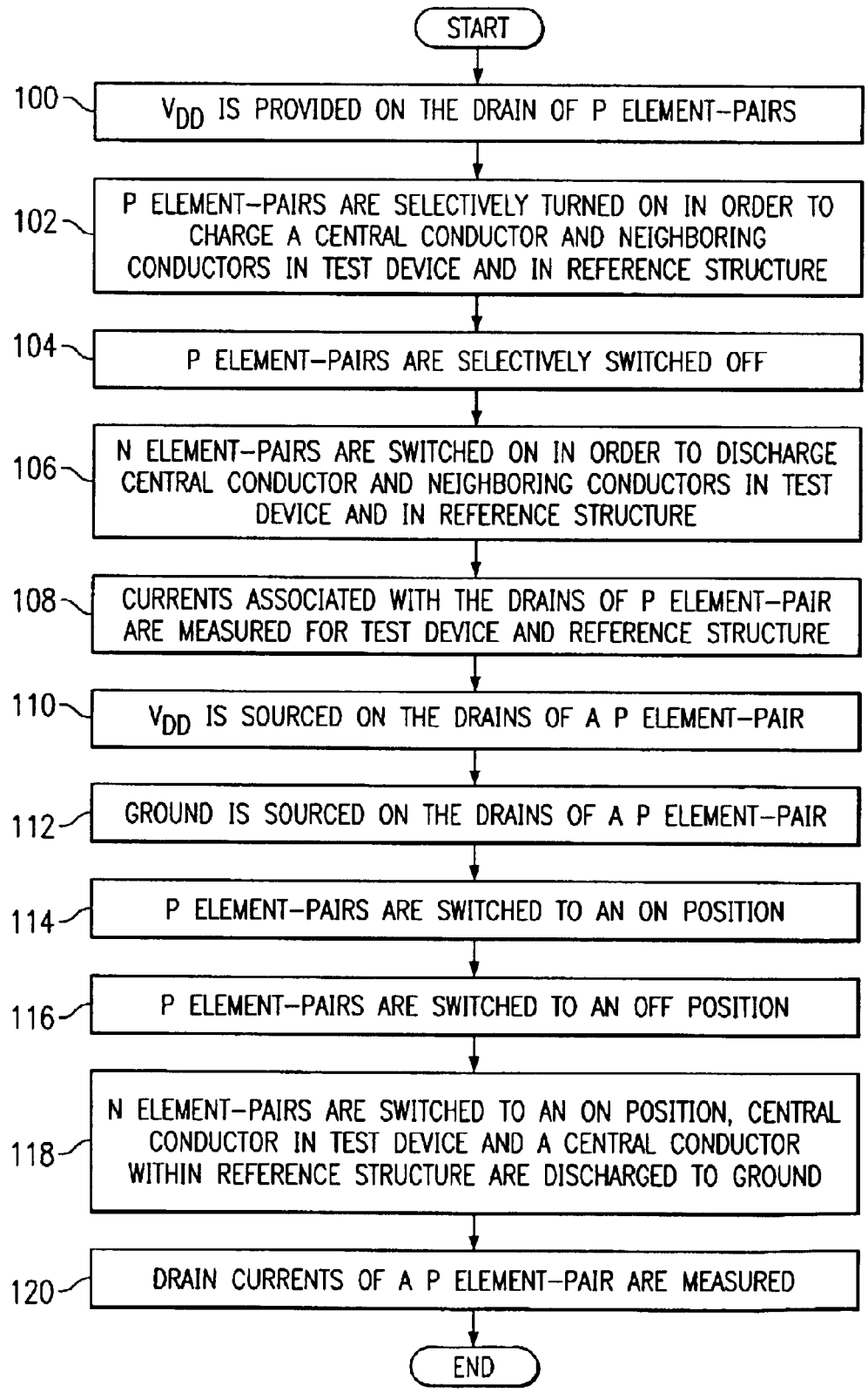

SYSTEM AND METHOD FOR USING A CAPACITANCE MEASUREMENT TO MONITOR THE MANUFACTURE OF A SEMICONDUCTOR

CROSS REFERENCE TO RELATED APPLICATIONS

This Application is related to U.S. patent application Ser. No. 10/172,190 filed Jun. 14, 2002,entitled "System and Method for Measuring a Capacitance of a Conductor."

TECHNICAL FIELD OF THE INVENTION

This invention relates in general to the field of semiconductor manufacturing and more particularly to a system and method for using a capacitance measurement to monitor the manufacture of a semiconductor.

BACKGROUND OF THE INVENTION

Metal capacitance is important to the functionality, performance, and reliability of integrated circuits. Thus, the ability to closely monitor the manufacture of integrated circuits and semiconductors is similarly important. Semiconductor characteristics or parameters that vary significantly from their designated values may cause significant problems in systems or architectures with precise or exact specifications. Elements such as metal thickness, metal width, metal spacing, and dielectric thickness each represent essential criterion to be controlled during the semiconductor manufacturing process. When system parameters become skewed because of inaccurate test results or errors in the manufacturing process, the byproduct may be incompatibility with neighboring components, poor performance, or the non-operation of associated devices.

Monitoring each layer of semiconductor formations during the manufacturing process may be performed by using methods that cut or section the actual product being manufactured. However, these destructive methods are costly in that they sacrifice semiconductor regions that would otherwise be used or sold. In addition, such methods do not offer the ability to share or to transfer precise information relating to existing or new design processes. The inability to share newly developed design concepts or new fabrication techniques may limit or add time and expense to the manufacturing process.

SUMMARY OF THE INVENTION

From the foregoing, it may be appreciated by those skilled in the art that a need has arisen for an improved monitoring approach that provides for effective scrutiny offered during the semiconductor manufacturing process. In accordance with one embodiment of the present invention, a system and method for using a capacitance measurement to monitor the manufacture of a semiconductor is provided that substantially eliminate or greatly reduce disadvantages and problems associated with conventional simulation, design, and measurement techniques.

According to one embodiment of the present invention, there is provided a method for using a capacitance measurement to monitor the manufacture of a semiconductor that includes positioning a measurement circuit in a scribe line area associated with the semiconductor. The scribe line area is indicative of a delineation that separates one or more portions of the semiconductor. A capacitance of one or more elements included within the one or more portions of the semiconductor is then measured using the measurement circuit. The method also includes comparing the capacitance measurement of the one or more elements included within the one or more portions of the semiconductor to a reference set of capacitance values such that a parameter associated with a manufacturing process that generated the semiconductor may be checked.

Certain embodiments of the present invention may provide a number of technical advantages. For example, according to one embodiment of the present invention, a measurement approach is provided that allows highly accurate capacitance measurements to be obtained for a semiconductor as it propagates through the manufacturing process. The enhanced accuracy of the capacitance measurement is a result of the elimination of capacitances between elements or conductors of a device under test. The elimination of their capacitance is achieved by charging and discharging multiple conductors in phase and thus effectively shorting neighboring conductors proximate to a conductor being targeted for the capacitance measurement. Accordingly, the capacitances of associated or neighboring elements that may otherwise act to negatively influence a capacitance measurement are negated or otherwise removed from the measurement equation. The enhanced capacitance measurement provides the opportunity to more closely monitor the manufacture of a semiconductor.

Another technical advantage of one embodiment of the present invention is a result of the efficient use of the scribe line area, which would otherwise be sacrificed when integrated circuits are divided or sectioned into multiple portions. The capacitance of one or more target conductors to one or more selected conductors in a multiple-conductor structure may be measured, whereby the capacitance value may be converted into a capacitance per unit length. This unique capacitance may then be compared with simulation values in order to determine whether or not the semiconductor manufacturing process is adequate for its intended design. Such a monitoring function may be critical where specifications or design standards are designated to be within certain ranges or within specified parameters.

Yet another technical advantage of one embodiment of the present invention is a result of the unique capacitance measurement obtained by the measurement circuit. The unique capacitance measurement may be used as an identification tag for persons or entities wishing to identify a semiconductor structure by using its associated capacitance value. In this sense, the unique capacitance parameter operates as an identifier indicative of the unit or component associated with that capacitance value. This unique identification may further provide for optimal communications between entities wishing to glean information about a semiconductor device, component, element, or object. Embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which:

FIG. 4 is a simplified circuit diagram of a measurement system for measuring a capacitance of a portion of a semiconductor;

FIGS. 5A–C are diagrammatic views illustrating a reference structure, a test device, and a net structure respectively that are associated with the measurement system;

FIG. 6 is a flowchart illustrating a series of steps associated with a method for measuring a capacitance of a portion of a semiconductor.

DETAILED DESCRIPTION OF THE INVENTION

Figure 1:
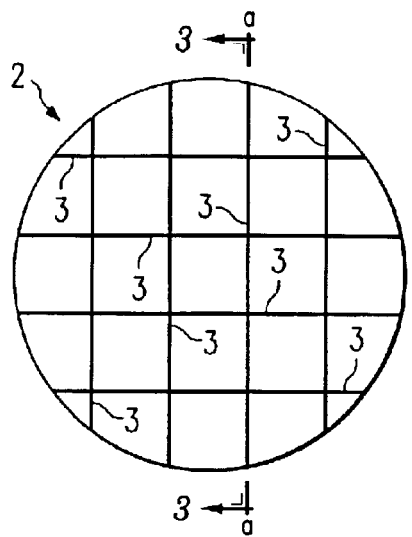
FIG. 1 is a simplified diagram of an example semiconductor generated by a manufacturing process.

FIG. 1 is a simplified diagram of an example semiconductor 2 that is propagating through a semiconductor manufacturing process. Semiconductor 2 is illustrated as a circular wafer-like structure that includes multiple sections of semiconductor elements within the wafer. Semiconductor 2 additionally includes a series of rectilinear and transverse scribe lines 3 that divide the sections within the wafer. These scribe lines may be used to divide semiconductor 2 into any number of suitable semiconductor elements, which may represent integrated circuits for example to be later used in independent operations. A scribe line area generally represents a sacrificial area used to indicate where semiconductor 2 is to be cut or sectioned at a designated stage in the manufacturing process. Scribe lines 3 (also referred to as saw lines) operate to guide a suitable cutting element that divides semiconductor 2 into multiple components or devices for subsequent implementation.

FIG. 1 additionally illustrates a cross-section line 'a'—'a' positioned along an arbitrary selected one of scribe lines 3 within semiconductor 2. The cross-section illustrates where a cutting tool or a sawing instrument may be implemented in order to separate portions of semiconductor 2 into individual semiconductor elements. Cross-section 'a'—'a' may be used to separate semiconductor 2 into two components, whereby a capacitance measurement may be taken at any point along the scribe line area in accordance with the teachings of the present invention. This scribe line area may be approximately 70 μm in width, or alternatively any other suitable width according to the particular component, device, or element being manufactured and tested. In addition, the scribe line area length may similarly be any suitable length where appropriate and based on the component, device, or element being manufactured.

In accordance with the teachings of the present invention, capacitance measurements may be taken along the scribe line area of semiconductor 2 based on any number of conductors that are accessible by the measurement circuit used (an example of which is described in more detail below with reference to FIG. 4). The measured capacitance values may then be converted into indicators or feedback associated with the semiconductor manufacturing process. By repeating several capacitance measurements across the associated semiconductor wafer, manufacturing parameters such as metal width, metal thickness, metal spacing, and dielectric, or any other suitable parameter may be monitored, controlled or modified where appropriate in order to achieve a targeted or desired specification. This monitoring feature may be implemented on a wafer-by-wafer basis, on a die-by-die basis, on a section-by-section basis, or at any other suitable designated area where it would otherwise be difficult to monitor the semiconductor manufacturing process.

This monitoring feature represents an efficient use of the scribe line area, which would otherwise be sacrificed as integrated circuits or other elements are divided or sectioned into multiple portions. The total capacitance of a targeted conductor, and its capacitance to selected conductors in a multiple-conductor structure may be measured, whereby each capacitance value may be converted into a capacitance per unit length. The capacitance values may then be compared with simulation values in order to determine whether or not the semiconductor manufacturing process is adequate for its intended design. Such a monitoring function may be critical where specifications or design standards are designated to be within certain ranges or within specified parameters.

Figure 2:
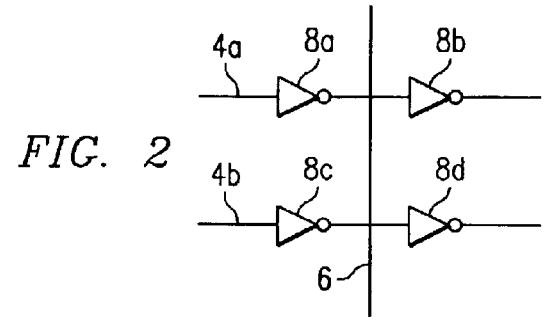
FIG. 2 is a simplified circuit diagram of multiple example elements included within the semiconductor.

FIG. 2 illustrates a simplified circuit diagram of a number of example elements that may be revealed when semiconductor 2 is divided along the scribe line area. FIG. 2 includes multiple conductors 4a and 4b (also referred to herein as wires, lines, or interconnects), a transverse conductor 6, and multiple inverters 8a–d. These elements may be included in an integrated circuit and accessed after sectioning semiconductor 2 along its associated scribe line 3. FIG. 2 represents an example circuit used for purposes of teaching and may alternatively be any other circuit arrangement, configuration, architecture, unit, or structure where appropriate. For purposes of simplicity, conductors 4a and 4b are illustrated as receiving a potential input signal, whereby that signal may be inverted twice by inverters 8a–8d.

Figure 3:
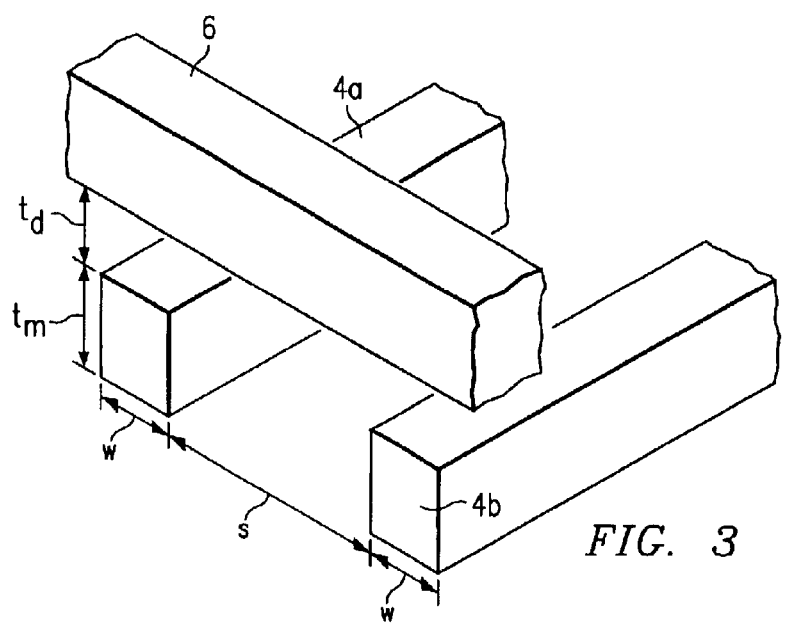
FIG. 3 is a simplified diagrammatic perspective view of the example elements.

FIG. 3 illustrates additional details associated with the circuit of FIG. 2. FIG. 3 illustrates a magnified cross-sectional view of what may be potentially accessible after semiconductor 2 is cut or sectioned along the scribe line area. FIG. 3 also illustrates that conductors 4a and 4b and transverse conductor 6 may occupy various metal layers or planes in an integrated circuit. Conductors 4a and 4b and transverse conductor 6 are illustrated as being generally tall and narrow, however these elements may alternatively be any suitable shape or size where appropriate.

A series of measurement dimensions are also illustrated in FIG. 3 and may be used in order to control a manufacturing process associated with semiconductor 2. FIG. 3 illustrates a line width dimension as 'w' that corresponds to the width of conductors 4a and 4b. The spacing between the conductors 4a and 4b is identified as 's' in FIG. 3. The thickness of conductors 4a and 4b is also identified in FIG. 3 as '$t_m$.' A suitable insulating or dielectric material may exist between conductors 4a and 4b and transverse conductor 6. The thickness of this dielectric is identified in FIG. 3 as '$t_d$.' It is important to note that the arrangement illustrated in FIG. 3 has only been offered for purposes of teaching. Conductors 4a and 4b and transverse conductor 6 may be routed in an integrated circuit in any suitable manner where appropriate, occupying any number of planes adequate to accommodate design considerations for each structure.

In operation, capacitance measurements of the elements illustrated in FIG. 3 may be taken, whereby conductor specifications, routing patterns, etching, and other suitable semiconductor parameters may be controlled or otherwise confined to designated specification guidelines. A simulation may be designed or created that includes exemplary or target measurements that correspond to the measurement dimensions illustrated in FIG. 3. For example, a simulation may be conducted and a target capacitance determined that provides an optimal capacitance range per unit length. After measuring a capacitance in the scribe line area of semiconductor 2, the capacitance measurement may then be converted into a capacitance value per unit length. By correlating the simulation capacitance value to the actual capacitance measurement in the scribe line area, a synchronization may be executed between design simulations or target measurements and the actual capacitance measurements for semiconductor 2 that propagates through the manufacturing process. Thus, the interconnect structures exposed by a cut or section at the scribe line area reveal interconnects or conductor elements to which a capacitance is sought to be determined in a non-destructive way. A capacitance may then be identified for one line with respect to a corresponding number of arbitrary neighboring lines. Where tested capacitance values fall outside of the designated range, it may be presumed that an error has occurred in the manufacturing process. This is described in greater detail immediately below with reference to an example offered for purposes of teaching.

An example is offered with respect to the designated measurement dimensions illustrated in FIG. 3. In accordance with an example embodiment of the present invention, 'w' may be in the order of 0.25 μm, +/−0.02 μm. This would indicate that the width of conductors 4a and 4b should be no greater than 0.27 μm and no less than 0.23 μm. In addition, $t_m$ and $t_d$ may have similar designated ranges, whereby measurements that are below or beyond this range indicate some flaw or error that occurred in the manufacturing process. Based on these proscribed parameters of 'w,' 's,' '$t_m$' and '$t_d$,' a simulated capacitance value per unit length is determined. After this value is obtained, it may be compared to a capacitance measurement taken from the scribe line area of semiconductor 2 propagating through the manufacturing process. After a suitable capacitance range is designated, a comparison may then be made between the measured capacitance value (after it is converted into a capacitance value per unit length) and the simulation capacitance value. In cases where the scribe line area of semiconductor 2 offers capacitance values that are below or above the simulation capacitance range, this may be indicative of a manufacturing flaw or error that needs to be addressed or corrected.

The use of conductor width, conductor spacing, conductor thickness, and dielectric thickness represent examples only of elements that may be used for purposes of designing a simulation. Alternatively, various other semiconductor parameters or characteristics may be used that are adequate to provide capacitance values for measurement circuits implemented in the scribe line area of semiconductor 2. It is foreseeable that system designers or semiconductor manufacturers may designate other appropriate routing patterns of interest or other suitable conductor characteristics to be used as a simulation basis. For example, a designer may be interested in a capacitance associated with one layer of interconnects with respect to another layer of interconnects within a semiconductor. The unique capacitance parameters measured may also be used for alternative purposes in accordance with the teachings of the present invention. For example, the unique capacitance parameters may be used to identify an associated component, element, device, or object that is associated with a given unique capacitance value. The unique capacitance may operate as a tag and be read by other entities in order to identify the semiconductor or device associated therewith. This would allow any entity to determine an identity of a component or device based on a measured capacitance value. The unique capacitance values may be stored in a table, potentially residing in a suitable storage unit (such as a database for example). The database may include an identifier that correlates to a device or a component related to or otherwise associated with the unique capacitance parameter.

FIG. 4 is a simplified block diagram of a measurement system 10 that may be inserted into the scribe line area of semiconductor 2 for measuring a capacitance associated therewith. Measurement system 10 includes test device 12 (that is included within semiconductor 2), a reference structure 14, a first set of p and n element-pairs 16 and 18, and a second set of p and n element-pairs indicated generally at 24 and 26. Measurement system 10 additionally includes a p-pulse train input indicated generally at 30 and an n-pulse train input indicated generally at 32. In general, each element or section within test device 12 may be coupled to an additional set of p and n element-pairs similar to those illustrated in FIG. 1.

Measurement system 10 operates to measure a capacitance associated with an element or section within test device 12. Elements within test device 12 may be selectively charged and discharged in response to p-pulse train 30 and n-pulse train 32. P element-pairs 16 and 24 and n element-pairs 18 and 26 may be switched ON and OFF at a designated frequency such that two currents may be measured at the drains associated with p element-pair 16. The currents may then be subtracted from each other in order to obtain a net current that reflects the capacitance of an element within test device 12 with respect to other neighboring elements within test device 12. Accordingly, elements within test device 12 may be charged and discharged either in or out of phase, in order to obtain a current at a corresponding drain that provides a basis for determining a capacitance associated with only the designated element of test device 12.

In addition, reference structure 14 may be used generally to offset parasitic capacitance effects of transistors or internal circuitry associated with measurement system 10. For example, p element-pair 16 and n element-pair 18 may each include some capacitance that may influence or otherwise skew a capacitance measurement that is associated with test device 12. Reference structure 14 may operate to eliminate parasitic capacitances by compensating for their presence when currents are measured at the drains of p element-pair 16. Accordingly, one drain current associated with reference structure 14 may be subtracted from another drain current associated with test device 12 such that inherent capacitances are effectively eliminated.

Additionally, the operation of charging and discharging elements within test device 12 using p-pulse train 30 and n-pulse train 32 offer a capability for measuring the average steady-state currents on the drains of p element-pair 16. In this manner, an alternating current (AC) phenomenon may be converted into a direct current (DC) value that may be quickly and accurately measured.

Measurement system 10 may generally be any suitable size, such as 30 μm wide by 100 μm long for example, such that it may adequately fit into the scribe line area of semiconductor 2. Measurement system 10 may alternatively be any suitable width and length where appropriate such that it may be used to make a capacitance measurement in the scribe line area of a device, component or element. Measurements taken in the scribe line area of semiconductor 2 may be performed in milliseconds and sensitive or accurate at the attofarad level in accordance with a particular embodiment of the present invention.

Test device 12 is an element, a structure, or an object having a capacitance associated therewith to be evaluated or measured by measurement system 10. Test device 12 may include a central conductor 36, a set of neighboring conductors 38 and 40 proximate to central conductor 36, and a plate 44. In a particular embodiment of the present invention, central conductor 36 is the target element to which a capacitance measurement is sought to be taken. Central conductor 36 may be any wire, object, component, or element capable of generating a capacitance value. Central conductor 36 may be within or external to any component, device, system, or architecture. Neighboring conductors 38 and 40 may be any conductive or non-conductive elements positioned in the vicinity of central conductor 36. Neighboring conductors 38 and 40 may be any wire, object, component, or element that may have a capacitance value associated with them. The inputs and outputs associated with test device 12 may correspond to data pathways or couplings to any suitable element, such as logic gates, semiconductors, or any other component, device, object, or element. In a particular embodiment of the present invention, conductors 38 and 40 are physically shorted through a connection such that both may be charged and discharged by p and n element-pairs 24 and 26. In at least one respect, neighboring conductors 38 and 40 represent a single conductor as their connection effectively provides a short. In general, conductors 38 and 40 need not be connected, and each conductor may be independently charged and discharged by separate p and n element-pairs. Although illustrated as a straight line, central conductor 36 and neighboring conductors 38 and 40 may be any suitable shape and configured, arranged, or positioned in any appropriate manner where appropriate according to particular needs.

In a particular embodiment of the present invention, central conductor 36 is the target element to which a capacitance measurement is sought to be taken. Central conductor 36 may be any wire, object, component, or element capable of generating a capacitance value, such as conductors 4a and 4b as illustrated in FIGS. 2 and 3. The inputs and outputs associated with test device 12 may correspond to data pathways or couplings to any suitable element, such as logic gates, semiconductors, or any other component, device, object, or element such as the semiconductor elements illustrated in FIG. 1.

P element-pairs 16 and 24 and n element-pairs 18 and 26 are p and n semiconductor devices respectively that may switch ON and OFF in response to an applied voltage potential and pulse train inputs provided by p-pulse train 30 and n-pulse train 32, respectively. P element-pairs 16 and 24 may be any suitable p device, such as a P-MOSFET, for example, that is operable to selectively charge any of the elements within test device 12. In addition, n element-pairs 18 and 26 may be any suitable n device, such as an N-MOSFET, for example, that is operable to selectively discharge any of the elements within test device 12. Alternatively, p element-pairs 16 and 24 and n element-pairs 18 and 26 may be any suitable semiconductor component, element, or device, or a non-semiconductor element that is operable to provide selective charging and discharging of any element within test device 12. Suitable algorithms may be implemented in order to switch the potential of the drains of p element-pair 24 between $V_{DD}$ and ground or to selectively switch other semiconductor devices within measurement system 10 to ON and OFF positions.

P element-pairs 16 and 24 and n element-pairs 18 and 26 may be used to independently charge and discharge elements within test device 12 in a programmed manner in order to allow for the measurement of capacitances between any combination of elements or bodies in a multi-element environment of test device 12. By charging and discharging multiple conductors in phase, the capacitance between the conductors may be eliminated because no charge difference occurs between the conductors. This approach achieves the effect of an alternating current (AC) shorting of the conductors. The effect of p-pulse train 30 may be controlled by the application of a $V_{DD}$ potential to the drain of p element-pairs 16 and 24.

P element-pairs 16 and 24, and n element-pairs 18 and 26 may be high-voltage transistors in accordance with one embodiment of the present invention. Alternatively, any suitable voltage transistors may be used such that conductors within reference structure 14 and test device 12 are adequately charged and discharged. The use of high-voltage transistors, such as 3.3 volt transistors for example, may increase the current measured by current meters 52 and 54, which in turn may increase capacitance measurement accuracy. Gated diodes may be used where appropriate in order to provide antennae protection for p element-pairs 16 and 24 and n element-pairs 18 and 26.

In operation, p element-pair 16 receives a voltage potential of $V_{DD}$ as illustrated in FIG. 4. As p element-pair 16 and n element-pair 18 switch to ON and OFF positions respectively, central conductor 36 may respond by charging to a voltage potential of $V_{DD}$. As p element-pair 16 and n element-pair 18 switch to OFF and ON positions respectively, central conductor 36 may respond by discharging to ground. In addition, p element-pair 24 may be suitably toggled between $V_{DD}$ and ground. P element-pair 24 and n element-pair 26 are coupled to neighboring conductors 38 and 40 through a connection 48 as illustrated in FIG. 4. Connection 48 operates as a short between neighboring conductors 38 and 40 in order to form a single conductor when a potential is applied to neighboring conductors 38 and 40. Depending on whether a voltage potential of $V_{DD}$ is applied to the drains of p element-pair 24 or the respective drains are grounded, neighboring conductors 38 and 40 may be charged and discharged in phase with central conductor 36 or kept at ground respectively. When neighboring conductors 38 and 40 are kept at ground, the current measured at the drain of p element-pair 16 is due to the capacitance of central conductor 36 with respect to neighboring conductors 38 and 40 and plate 44.

When neighboring conductors 38 and 40 are charged and discharged in phase (at any appropriate frequency, such as 1–10 MHz, for example) with central conductor 36, the capacitance associated with neighboring conductors 38 and 40 is eliminated such that a current may be measured that reflects only the capacitance with respect to plate 44. Thus, a total capacitance that accounts for all elements within test device 12 may be measured and an additional capacitance associated with central conductor 36 may also be measured with respect to plate 44. The latter capacitance value may then be subtracted from the former capacitance value in order to obtain a capacitance due to neighboring conductors 38 and 40.

Reference structure 14 is a null structure that is used to offset parasitic capacitances found in measurement system 10. Elements such as transistors, logic elements, or other semiconductor components or objects offer a capacitance that needs to be accounted for when making a capacitance measurement for central conductor 36. Reference structure 14 may comprise material similar to that of test device 12 in a particular embodiment of the present invention. However, reference structure 14 may alternatively comprise any suitable material according to particular needs. Reference structure 14 may also be the same height and include multiple conductors that are approximately the same width as test device 12. Reference structure 14 may change structurally in response to changes in test device 12. Generally, reference structure 14 may be configured to be symmetrical with respect to test device 12, whereby reference structure 14 includes elements similar to those included in test device 12. Reference structure 14 may include two neighboring conductors (similar to test device 12) that are shorted by a wire coupled to p element-pair 24 and n element-pair 26 in a particular embodiment of the present invention. A central conductor associated with reference structure 14 may be coupled to p element-pair 16 and n element-pair 18 as illustrated in FIG. 4. In addition, reference structure 14 includes an overhang feature that is associated with corresponding conductors and that is similarly provided in test device 12. This overhanging symmetry between reference structure 14 and test device 12 and its corresponding effects for purposes of taking capacitance measurements are described in more detail below with reference to FIGS. 5A–C. Suitable software may be used to configure reference structure 14 or other null devices that are used as a reference in measuring a capacitance associated with test device 12. It is important to note that reference structure 14 may be any suitable device or element having any suitable characteristics such that one or more parasitic capacitances may be negated or accounted for in measuring a capacitance value of central conductor 36.

In operation, reference structure 14 generates a current provided at a drain of p element-pair 16. The drain current associated with reference structure 14 may be subtracted from the current measurement taken at the other drain of p element-pair 16 in order to compensate for the impact of inherent capacitance effects. The removal or compensation of elements within measurement system 10 provide for more accurate capacitance measurements as elements that would otherwise skew a capacitance measurement associated with central conductor 36 are offset by reference structure 14.

Reference structure 14 cooperates with test device 12 in order to obtain a capacitance value associated with an element within test device 12. When p element-pair 16 is in an ON position, p element-pair 16 operates to charge central conductor 36 to a $V_{DD}$ potential. When p element-pair 16 is switched to an OFF position and n element-pair 18 is switched to the ON position, central conductor 36 may then be discharged to ground. Central conductor 36 continues to charge and discharge as associated p and n devices are switched ON and OFF. During the charging and discharging, a measurement of a current associated with the drain of p element-pair 16 may be obtained. The same general procedure is occurring with respect to reference structure 14.

P-pulse train 30 and n-pulse train 32 control or otherwise switch ON and OFF p and n devices or elements coupled thereto within measurement system 10. P-pulse train 30 and n-pulse train 32 may be generated by suitable pulse generators operable to provide pulsing signals to p element-pairs 16 and 24 and n elements pairs 18 and 26. P element-pairs 16 and 24 and n element-pairs 18 and 26 receive similar inputs from p-pulse train 30 and n-pulse train 32 respectively. P-pulse train 30 and n-pulse train 32 represent two continuous pulse trains that may be timed relative to each other at an initiation stage of measurement system 10. The pulsing signals may be applied when a set of probes 58 and 60 (discussed in more detail below) contact corresponding probe pads (potentially including a short delay in order to achieve a steady-state).

Measurement system 10 may also include multiple inverters 34a and 34b. Inverters 34a and 34b may be added in order to charge and discharge associated p and n devices in and out of phase in order to improve measurement accuracy. A suitable multiplexing element (not shown) may also be provided in conjunction with inverters 34a and 34b such that one or more signals are adequately processed within measurement system 10. Inverters 34a and 34b may be used to double current measurements-obtained by current meters 52 and 54. It is important to note that inverters 34a and 34b may be eliminated where appropriate, whereby measurement system 10 continues to function and operate normally. In addition, program testers may be configured in order to provide a pair of non-overlapping steady-state pulse trains to transistor switch inputs. The production testers may enable the measurement of steady-state currents on probes 58 and 60. By increasing the current being measured for a given structure, the accuracy and efficiency of measurement system 10 may be significantly improved. The production testers may be used to measure current at a pico ampere level in accordance with a particular embodiment of the present invention.

Plate 44 is an element that may be grounded and that provides an environment for test device 12 during measurement of the capacitance associated with central conductor 36. Plate 44 may also be a conductor that is coupled to an additional set of p and n element-pairs similar to those at 24 and 26, and that is operable to charge and discharge where appropriate in order to obtain a capacitance measurement associated with central conductor 36. Whether plate 44 is grounded or set at a certain potential may be controlled by inputs provided to its p and n element-pairs.

A pair of current meters 52 and 54 may be provided at each of the drains of p element-pair 16. Current meters 52 and 54 operate to measure a current associated with reference structure 14 and test device 12 respectively. By subtracting the current obtained by current meter 52 from the current obtained by current meter 54, a net current may be obtained that compensates for internal parasitic capacitances found in measurement system 10. Thus, the impact of transistors or circuitry within measurement system 10 may be removed or otherwise accounted for by the implementation of reference structure 14 as a corresponding inherent current is factored into the capacitance measurement. After obtaining a net current, a capacitance may then be determined based on the equation: I(current)=C (capacitance)×V (voltage)×f (frequency). Frequency represents the frequency at which elements within test device 12 are charged and discharged, whereby the voltage represents the potential to which elements such as central conductor 36 are charged.

Probes 58 and 60 may also be included in measurement system 10 in order to provide a capacitance measurement associated with test device 12. Probes 58 and 60 may include suitable probe pads where appropriate and are coupled to current meters 52 and 54, respectively. Probes 58 and 60 may also include suitable software operable to identify additional parameters associated with test device 12 or to selectively determine information associated with test device 12 that is based on measurements taken or data collected by measurement system 10.

FIGS. 5A–C are diagrammatic views that illustrate an overhanging effect resulting from a conductor that protrudes beyond the length of an underlying plate structure. Reference structure 14 is illustrated in FIG. 5A, test device 12 is illustrated in FIG. 5B, and a resultant or net structure 60 is illustrated in FIG. 5C in order to teach the effects of an overhanging element or characteristic. Test device 12 includes conductor 36 having a length of $l_1$ and reference structure 14 includes a conductor having a length of $l_2$. Test device 12 includes plate 44 and reference structure 14 includes a similar plate element having approximately the same height. Resultant structure 60 represents the subtraction of l$_2$ from l$_1$ in order to provide a result that compensates for the overhanging effect of conductors that protrude beyond underlying elements or the environments associated with reference structure 14 and test device 12. For example, if l$_1$ and l$_2$ were 120 μm and 20 μm respectively, resultant structure 60 would reflect an effective capacitance over a 100 μm unit length.

Resultant structure 60 represents a more exact capacitance associated with the corresponding conductor that is targeted for measurement. The three-dimensional edge effects of conductors that may otherwise generate an electric field energy (thereby influencing capacitance measurements) may be negated with the implementation of reference structure 14. Accordingly, a two-dimensional capacitance may be obtained that removes the effects of the protruding ends of the conductor. A two-dimensional capacitance may be generally easier to model or otherwise to design for in developing a system or an architecture that includes the corresponding conductor.

The negation of overhanging effects is beneficial for a number of additional reasons. For example, it may be generally easier to correlate silicon measurements with two-dimensional analytical simulations instead of three-dimensional elements. In addition, parasitic extraction tools may require two-dimensional capacitance coefficients not provided by a three-dimensional element. Thus reference structure 14 allows end regions of a three-dimensional structure of a conductor to be accounted for in order to generate a more ideal two-dimensional capacitance per unit length result.

In operation, measurement system 10 may obtain a capacitance value for a designated element within test device 12. P element-pair 16 and n element-pair 18 may be used to charge and to discharge central conductor 36 of test device 12 and a similar central conductor of reference structure 14. P element-pair 24 and n element-pair 26 may also be used to perform other tasks, such as to maintain neighboring conductors 38 and 40 of test device 12 (and corresponding neighboring conductors within reference structure 14) at a reference potential. In addition, p element-pair 24 and n element-pair 26 may be used to charge neighboring conductors 38 and 40 of test device 12 (and corresponding neighboring conductors within reference structure 14) to a potential of V$_{DD}$ and further to discharge them synchronously in phase with central conductor 36. Additionally, p element-pair 24 and n element-pair 26 may be used to charge neighboring conductors 38 and 40 within test device 12 (and corresponding neighboring conductors within reference structure 14) to a potential of V$_{DD}$ and further to discharge them 180° out of phase with respect to central conductor 36. This operation may function to double the capacitance and corresponding measured current at a drain associated with p element-pair 16, which generally results in improved measurement accuracy.

Also, plate 44 and the plate associated with reference structure 14 may be kept at a designated reference potential, such as ground for example. Two non-overlapping pulse trains (p-pulse train 30 and n-pulse train 32) may be applied to p element-pairs 16 and 24 and n element-pairs 18 and 26. Two sets of measurements may then be obtained in accordance with one embodiment of the present invention.

In the first set of measurements, V$_{DD}$ may be provided on the drain of p element-pair 16 and p element-pair 24 by any suitable voltage source or an appropriate connection thereto. The associated p element-pairs may be turned ON in order to charge central conductor 36 and neighboring conductors 38 and 40 in both test device 12 and in corresponding elements within reference structure 14. The p elements may then be selectively switched OFF. N element-pairs 18 and 26 may then be switched ON in order to discharge central conductor 36 and neighboring conductors 38 and 40 in test device 12 and correspondingly in reference structure 14. The cycle may continue at any suitable frequency that produces reliable and suitable charging and discharging functions. Currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In the second set of measurements, V$_{DD}$ is sourced on the drains of p element-pair 16 and may be provided by any suitable voltage source or an additional voltage source or an appropriate connection thereto. A ground may then be sourced on the drains of p element-pair 24 that keeps neighboring conductors 38 and 40 in test device 12 and in reference structure 14 at a fixed potential. At this point when p element-pairs 16 and 24 are switched to an ON position, only central conductor 36 in test device 12 and a corresponding central conductor of reference structure 14 are charged to V$_{DD}$. After these p elements are switched to an OFF position, n element-pairs 18 and 26 may be switched to an ON position and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured.

The second set of measurements provides a total capacitance of central conductor 36 with respect to plate 44 and to neighboring conductors 38 and 40. The accuracy of the measurements may be checked by monitoring the DC characteristics of each of p element-pairs 16 and 24 and n element-pairs 18 and 26. The accuracy may also be checked by observing the linearity of the current measurements against frequency and voltage values.

FIG. 6 is a flowchart illustrating a series of steps associated with a method for measuring a capacitance of a conductor in accordance with one embodiment of the present invention. The method begins at step 100 where V$_{DD}$ is provided on the drains of p element-pairs 16 and 24 by any suitable voltage source or an appropriate connection thereto. At step 102, the associated p element-pairs may be turned ON in order to charge central conductor 36 and neighboring conductors 38 and 40 in both test device 12 and in corresponding elements within reference structure 14. The p elements may then be selectively switched OFF at step 104. At step 106, n element-pairs 18 and 26 may then be switched ON in order to discharge central conductor 36 and neighboring conductors 38 and 40 in test device 12 and in corresponding elements within reference structure 14. The cycle may continue at any suitable frequency that produces reliable and suitable charging and discharging functions for measurement system 10.

At step 108, currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In a second set of measurements beginning at step 110, $V_{DD}$ is sourced on the drains of p element-pair 16 and may be provided by any suitable voltage source, or an additional voltage source, or an appropriate connection thereto. A ground may then be sourced on the drains of p element-pair 24 that keeps neighboring conductors 38 and 40 in test device 12 and in reference structure 14 at a fixed potential. This operation is illustrated by step 112. At step 114, when p element-pairs 16 and 24 are switched to an ON position, only central conductor 36 in test device 12 and a corresponding central conductor of reference structure 14 are charged to $V_{DD}$. After these p elements are switched to an OFF position at step 116, n element-pairs 18 and 26 may be switched to an ON position at step 118 and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured as illustrated in step 120.

The total capacitance of central conductor 36 with respect to plate 44 and to neighboring conductors 38 and 40 is provided by the second set of measurements. The accuracy of the measurements may be checked by monitoring the DC characteristics of each p element-pairs 16 and 24 and n element-pairs 18 and 26. The accuracy may also be checked by observing the linearity of the current measurements against frequency and voltage values.

Figure 7:
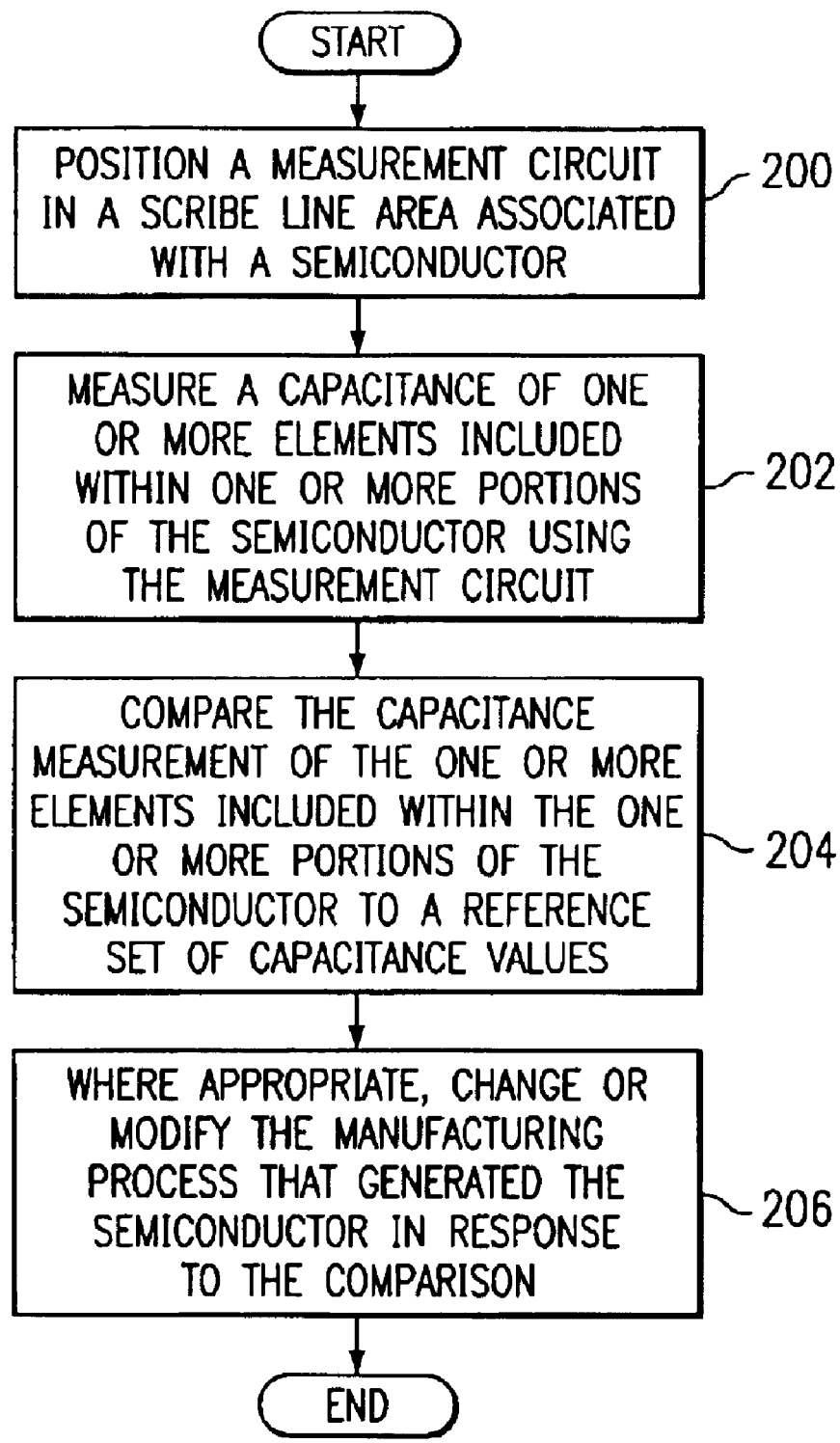
FIG. 7 is a flowchart illustrating a series of steps associated with a method for using a capacitance measurement to monitor the manufacture of a semiconductor.

FIG. 7 is a flowchart illustrating a series of steps associated with a method for measuring a capacitance of a portion of semiconductor 2 using measurement system 10 (or any other suitable capacitance measurement system) in accordance with one embodiment of the present invention. The method begins at step 200, where measurement system 10 may be positioned in a scribe line area associated with semiconductor 2. The capacitance of one or more elements included within portions of semiconductor 2 is then measured using measurement system 10 as illustrated by step 202. The elements included within the portions of semiconductor 2 may be wires, interconnects, portions of circuits, or conductors generally that define a portion of an integrated circuit or any other suitable structure (as described above).

At step 204, the capacitance measurement of the elements included within portions of semiconductor 2 are compared to a reference set of capacitance values such that a parameter associated with a manufacturing process that generated semiconductor 2 may be checked. The reference set of capacitance values may be based on a simulation element having substantially the same structural characteristics as semiconductor 2. The parameters associated with the manufacturing process may include for example items such as the line width of the conductors, the spacing of the conductors, the line thickness of the conductors, or a thickness associated with a dielectric positioned proximate to the conductors. At step 206, changes or modifications to the manufacturing process that generated semiconductor 2 may be executed in response to the comparison between targeted capacitance values and actual capacitance values.

Some of the steps illustrated in FIGS. 6 and 7 may be changed or deleted where appropriate and additional steps may also be added to each of the flowcharts. These changes may be based on specific measurement architectures or particular testing arrangements and configurations of associated elements and do not depart from the scope or the teachings of the present invention.

Although the present invention has been described in detail with reference to particular embodiments, it should be understood that various other changes, substitutions, and alterations may be-made hereto without departing from the spirit and scope of the present invention. For example, although the present invention has been described as operating with reference to a set of conductors, measurement system 10 may be extended to apply to any arbitrary number of conductors having any shape or configuration. Any device, element, or component capable of generating electric field energy, which serves as a basis for a capacitance measurement, may benefit from the teachings of the present invention.

Additionally, although the present invention has been described with reference to a single test device 12, measurement system 10 may be used to measure the total capacitance of multiple conductor structures (or multiple portions of test device 12) and further resolve the total capacitance of a target element into its corresponding components with use of a single structure. This single unit may include the addition of a p and n element-pair for each additional conductor that is introduced into test device 12 such that a scalability feature is achieved without a significant increase in area. Measurement system 10 operates generally to provide enhanced flexibility for measuring many capacitances from the same multiple conductor structure (which may be large and complex in certain circumstances). Measurement system 10 also operates to reduce the number of structures, whereby multiple variations may be achieved through test program controlling of DC voltages instead of moving or repositioning probes or changing pulse locations.

In addition, numerous other arrangements of measurement system 10 may be performed without departing from the scope of the present invention. For example, transistor arrangements may be inverted for adjacent test structures such that the structure occupies only half the width of the scribe line area of semiconductor 2. This arrangement allows structures to be placed such that one is below the other and extends them as long as possible in order to improve measurement accuracy.

Also, although measurement system 10 has been described as being implemented in conjunction with semiconductor 2, measurement system 10 may be used to measure capacitance values of any suitable element. Any device, component, unit, element, or object that generates a capacitance value may benefit from the teachings of the present invention. Semiconductor 2 and the elements included therein have only been offered for purposes of teaching and this should not be construed to limit any implementation of measurement system 10.

Moreover, although measurement system 10 has been described as being used in the scribe line area of semiconductor 2, any suitable capacitance measuring circuit may be implemented in the scribe line area in order to provide feedback relating to the manufacturing process. Measurement system 10 has only been offered for purposes of teaching one embodiment of the present invention. Numerous other capacitance measuring devices, components, circuits, and elements may be used without departing from the scope of the present invention. Additionally, the scribe line area has only been offered for purposes of teaching. The scribe line area may represent any point of sacrifice for an associated element. This sacrificial area is used in order to effectuate the measurement techniques in accordance with the teachings of the present invention. It should be clear that measurement system 10 may be implemented on any suitable portion of a device or element under test.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims.

Moreover, the present invention is not intended to be limited in any way by any statement in the specification that is not otherwise reflected in the appended claims. Various example embodiments have been shown and described, but the present invention is not limited to the embodiments offered. Accordingly, the scope of the present invention is intended to be limited solely by the scope of the claims that follow.

What is claimed is:

1. A method for measuring a capacitance of a semiconductor, comprising:
    positioning a measurement circuit in a scribe line area associated with a semiconductor, wherein the scribe line area is indicative of a delineation that separates one or more portions of the semiconductor;
    measuring a capacitance of one or more elements included within the one or more portions of the semiconductor using the measurement circuit;
    comparing the capacitance measurement of the one or more elements included within the one or more portions of the semiconductor to a reference set of capacitance values such that a parameter associated with a manufacturing process that generated the semiconductor may be checked; and
    storing the capacitance measurement in a database with an identifier that is indicative of the semiconductor such that the semiconductor is identified based on the capacitance measurement.

2. The method of claim 1, wherein the elements included within the portions of the semiconductor are conductors that define a portion of an integrated circuit.

3. The method of claim 2, wherein the parameter associated with the manufacturing process is selected from the group consisting of:
    (a) width of the conductors;
    (b) thickness of the conductors;
    (c) thickness associated with a dielectric positioned proximate to the conductors; and
    (d) spacing between the conductors.

4. The method of claim 1, wherein the reference set of capacitance values is based on a simulation element having substantially the same structural characteristics as the semiconductor.

5. The method of claim 1, wherein the manufacturing process that generated the semiconductor is changed in response to comparing the capacitance measurement of the one or more elements included within the one or more portions of the semiconductor to the reference set of capacitance values.

6. The method of claim 1, further comprising:
    identifying the semiconductor based on the capacitance measurement of the one or more elements included within the one or more portions of the semiconductor.

7. An apparatus for measuring a capacitance of a semiconductor, the apparatus comprising:
    a measurement circuit comprising:
        a first set of p and n element-pairs coupled to a first conductor and operable to selectively charge and discharge the first conductor in response to a voltage potential applied to the first set of p and n element-pairs;
        a second set of p and n element-pairs coupled to a second conductor and operable to selectively charge and discharge the second conductor in response to a voltage potential applied to the second set of o and n element-pairs, wherein currents are measured at drains associated with the first set of p element-pairs as the conductors charge and discharge such that a capacitance associated with the first conductor may be determined that is based on the drain currents; and
        a reference structure coupled to the first and second sets of p and n element-pairs and operable to provide a calibration element for measuring the capacitance associated with the first conductor;
    said measuring circuit positioned in a scribe line area associated with a semiconductor, wherein the scribe line area is indicative of a delineation that separates one or more portions of the semiconductor, and wherein the capacitance of one or more elements included within the one or more portions of the semiconductor is measured using the measurement circuit; and
    a reference set of capacitance values, wherein the capacitance measurement of the one or more elements included within the one or more portions of the semiconductor are compared to the reference set of capacitance values such that a parameter associated with a manufacturing process that generated the semiconductor may be checked.

8. The apparatus of claim 7, wherein the elements included within the portions of the semiconductor are conductors that define a portion of an integrated circuit.

9. The apparatus of claim 8, wherein the parameter associated with the manufacturing process is selected from the group consisting of:
    (a) width of the conductors;
    (b) thickness of the conductors;
    (c) thickness associated with a dielectric positioned proximate to the conductors; and
    (d) spacing between the conductors.

10. The apparatus of claim 7, wherein the reference set of capacitance values is based on a simulation element having substantially the same structural characteristics as the semiconductor.

11. The apparatus of claims 7, wherein the manufacturing process that generated the semiconductor is changed in response to comparing the capacitance measurement of the one or more elements included within the one or more portions of the semiconductor to the reference set of capacitance values.

12. The apparatus of claim 7, wherein the semiconductor may be identified based on the capacitance measurement of the one or more elements included within the one or more portions of the semiconductor.

13. The apparatus of claim 12, further comprising:
    a database operable to store the capacitance value with an identifier that is indicative of the semiconductor such that the semiconductor may be identified based on the capacitance measurement.

14. The apparatus of claim 7, further comprising:
a p-pulse generator operable to generate a p-pulse train that is communicated to each of the first and second sets of p element-pairs such that each of the first and second sets of p element-pairs may be selectively switched to ON and OFF positions.

15. The apparatus of claim 14, further comprising:
an n-pulse generator operable to generate an n-pulse train that is communicated to each of the first and second sets of n element-pairs such that each of the first and second sets of n element-pairs may be selectively switched to ON and OFF positions.

16. A method for measuring a capacitance of a semiconductor, the method comprising:

positioning a measurement circuit in a scribe line area associated with a semiconductor, wherein the scribe line area is indicative of a delineation that separates one or more portions of the semiconductor;

measuring a capacitance of one or more elements included within the one or more portions of the semiconductor using the measurement circuit, wherein the elements included within the portions of the semiconductor are conductors that define a portion of an integrated circuit; and comparing the capacitance measurement of the one or more elements included within the one or more portions of the semiconductor to a reference set of capacitance values such that a parameter associated with a manufacturing process that generated the semiconductor may be checked, wherein the reference set of capacitance values is based on a simulation element having substantially the same structural characteristics as the semiconductor, and wherein the manufacturing process that generated the semiconductor is changed in response to comparing the capacitance measurement of the one or more elements included within the one or more portions of the semiconductor to the reference set of capacitance values;

identifying the semiconductor based on the capacitance measurement of the one or more elements included within the one or more portions of the semiconductor; and storing the capacitance measurement in a database with an identifier that is indicative of the semiconductor such that the semiconductor is identified based on the capacitance measurement.

\* \* \* \* \*